(12) United States Patent
Jeon

(10) Patent No.: US 8,888,531 B2
(45) Date of Patent: *Nov. 18, 2014

(54) ELECTRICAL CONNECTOR AND CIRCUIT BOARD ASSEMBLY INCLUDING THE SAME

(71) Applicant: Tyco Electronics Corporation, Berwyn, PA (US)

(72) Inventor: Myoungsoo Jeon, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/910,670

(22) Filed: Jun. 5, 2013

(65) Prior Publication Data

US 2014/0080331 A1    Mar. 20, 2014

Related U.S. Application Data

(63) Continuation-in-part of application No. 13/270,622, filed on Oct. 11, 2011, now Pat. No. 8,465,323.

(51) Int. Cl.
| | |
|---|---|
| *H01R 13/648* | (2006.01) |
| *H01R 13/658* | (2011.01) |
| *H01R 13/6594* | (2011.01) |
| *H01R 13/652* | (2006.01) |
| *H05K 1/02* | (2006.01) |
| *H01R 4/66* | (2006.01) |
| *H01R 13/6582* | (2011.01) |

(52) U.S. Cl.
CPC ............ *H01R 4/66* (2013.01); *H01R 13/65807* (2013.01); *H01R 13/6594* (2013.01); *H01R 13/652* (2013.01); *H05K 1/0215* (2013.01); *H01R 13/6582* (2013.01)

USPC ..................................................... 439/607.07

(58) Field of Classification Search
CPC ............................. H01R 23/688; H01R 4/646
USPC .......... 439/607.07, 607.08, 108, 100, 607.05, 439/98
See application file for complete search history.

(56) References Cited

U.S. PATENT DOCUMENTS

| | | | |
|---|---|---|---|
| 4,720,770 A | 1/1988 | Jameson | |
| 6,752,640 B2 | 6/2004 | Chen | |
| 6,971,916 B2 | 12/2005 | Tokunaga | |
| 7,104,843 B2 | 9/2006 | Olson et al. | |
| 7,381,092 B2 | 6/2008 | Nakada | |
| 8,454,352 B2 * | 6/2013 | Whitford et al. | 431/61 |
| 2010/0062629 A1 * | 3/2010 | Feldman et al. | 439/219 |
| 2011/0117781 A1 * | 5/2011 | Stoner | 439/607.01 |
| 2012/0214343 A1 * | 8/2012 | Buck et al. | 439/607.05 |

* cited by examiner

*Primary Examiner* — Phuongchi T Nguyen

(57) ABSTRACT

Circuit board assembly including an electrical connector having a connector body having a mounting side and an array of signal contacts disposed along the mounting side. The array of signal contacts has gaps formed between adjacent signal contacts of the array. The circuit board assembly also includes a circuit board having an engagement side. The circuit board includes signal vias and ground vias that are exposed along the engagement side. The circuit board assembly also includes a grounding matrix that is positioned between the engagement side and the mounting side. The grounding matrix includes a plurality of ground contacts that are interconnected in a web-like manner to define a plurality of openings, wherein the signal contacts of the electrical connector extend through the openings to engage the signal vias. The ground contacts electrically couple the ground vias of the circuit board to a ground pathway through the electrical connector.

20 Claims, 11 Drawing Sheets

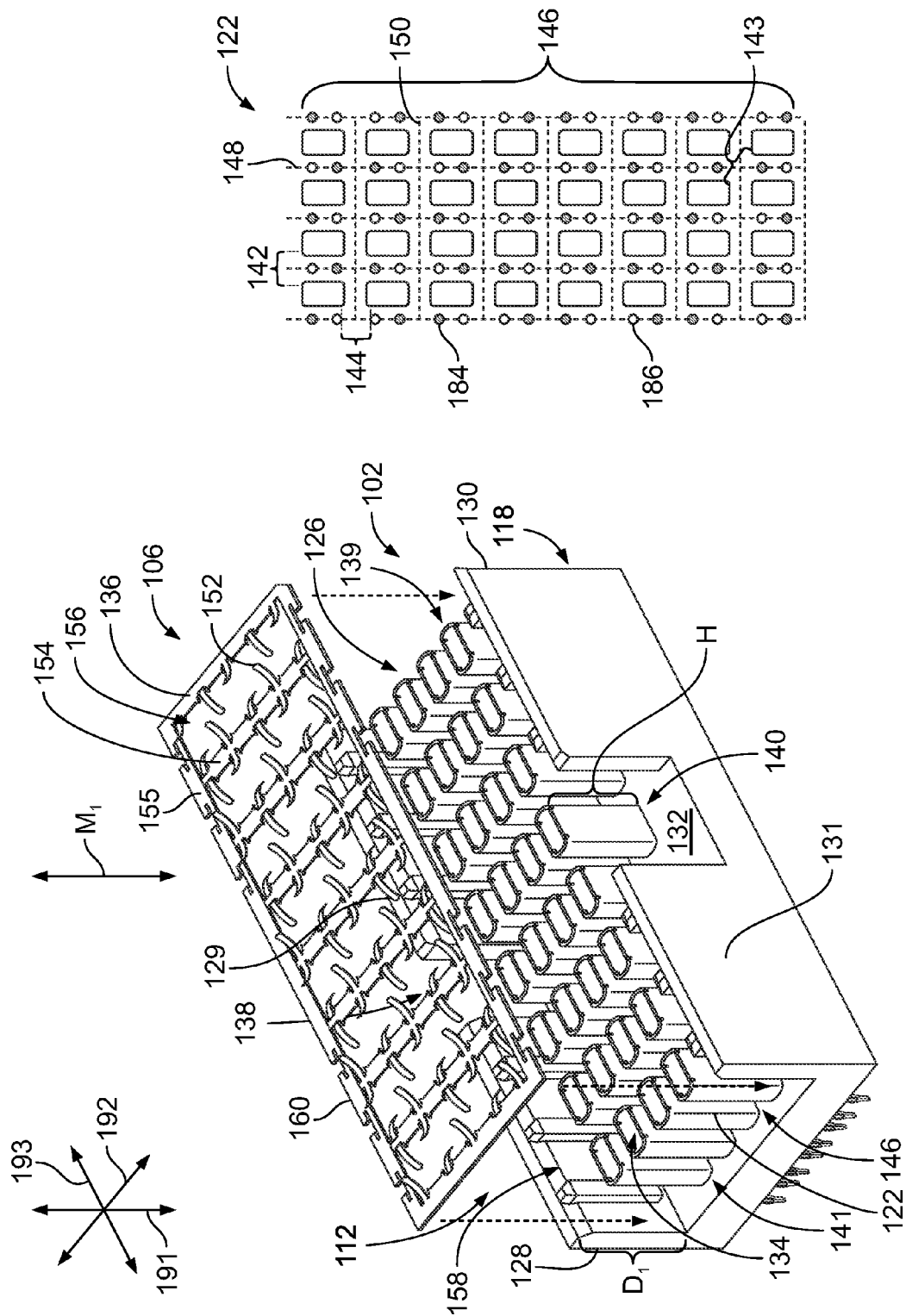

ELECTRICAL CONNECTOR AND CIRCUIT BOARD ASSEMBLY INCLUDING THE SAME

CROSS-REFERENCE TO RELATED APPLICATION

The present application is a continuation-in-part of U.S. application Ser. No. 13/270,622, filed Oct. 11, 2011, which is incorporated herein by reference in its entirety.

BACKGROUND OF THE INVENTION

The subject matter herein relates generally to electrical connectors, and more particularly, to electrical connectors having grounding features to improve electrical performance.

To meet digital communication demands, higher data throughput in smaller spaces is often desired for communication systems and equipment. Electrical connectors that interconnect circuit boards and other electrical components should therefore handle high signal speeds at large contact densities. One application environment that uses such electrical connectors is in high speed, differential electrical connectors, such as those common in the telecommunications or computing environments. In a traditional approach, two circuit boards are interconnected to each other in a backplane and a daughter card configuration using electrical connectors mounted to each circuit board.

At least one problem area is the interface between electrical components, such as between two electrical connectors. In some cases, the electrical connectors include conductive housings that function as shields for the electrical connectors. When the electrical connectors are mated together, the housings are also electrically coupled thereby establishing a return path between the electrical connectors. However, gaps along the interface can occur due to, for example, manufacturing tolerances of the electrical connectors or unwanted particles (e.g., dirt or dust) between the electrical connectors. These gaps can negatively affect the electrical performance of the connector assembly. The interface between an electrical connector and a circuit board may also have gaps that negatively affect the electrical performance of the assembly.

Accordingly, there is a need for electrical connectors and connector assemblies that can create a reliable interconnection between two electrical components along an interface.

BRIEF DESCRIPTION OF THE INVENTION

In one embodiment, a circuit board assembly is provided. The circuit board assembly includes an electrical connector including a connector body having a mounting side and an array of signal contacts disposed along the mounting side. The array of signal contacts has gaps formed between adjacent signal contacts of the array. The circuit board assembly also includes a circuit board having an engagement side. The circuit board includes signal vias and ground vias that are exposed along the engagement side. The circuit board assembly also includes a grounding matrix that is positioned between the engagement side and the mounting side. The grounding matrix includes a plurality of ground contacts that are interconnected in a web-like manner to define a plurality of openings, wherein the signal contacts of the electrical connector extend through the openings to engage the signal vias. The ground contacts electrically couple the ground vias of the circuit board to a ground pathway through the electrical connector.

In some aspects, the circuit board may include a conductive layer that is exposed along the engagement side. The conductive layer may be coupled to the ground vias, and the ground contacts may be configured to engage at least one of the conductive layer or the ground vias. In particular aspects, the circuit board may include a mask layer that covers portions of the conductive layer such that exposed contact areas of the conductive layer are formed along the engagement side. The ground contacts of the grounding matrix may be configured to engage the contact areas of the conductive layer.

The ground contacts may include distal ends. In some aspects, the distal ends may be permitted to engage and slide along the conductive layer when the electrical connector is mounted to the circuit board. The ground contacts may also include flex portions. The flex portions may be configured to move toward the mounting side of the connector body when the flex portions are compressed between the mounting side and the board surface of the circuit board.

In another embodiment, an electrical connector is provided that includes a connector body having a mounting side and an array of signal contacts disposed along the mounting side. The array of signal contacts has gaps formed between adjacent signal contacts of the array. The electrical connector also includes a grounding matrix extending along the mounting side. The grounding matrix includes a plurality of ground contacts that are interconnected in a web-like manner to define a plurality of openings, wherein the signal contacts of the electrical connector extend through the openings. The ground contacts are electrically coupled to the electrical connector. The grounding matrix includes attachment features that directly engage and couple to the electrical connector to hold the grounding matrix along the mounting side in a designated position.

In some aspects, the electrical connector includes signal conductors that have the signal contacts. The ground contacts are electrically coupled to one or more ground pathways that extend through the electrical connector when the grounding matrix is compressed between the electrical connector and an electrical component. In particular embodiments, the attachment features include projections that extend toward and engage the electrical connector.

In a further embodiment, a circuit board is provided that includes a board substrate having opposite first and second sides. The board substrate includes a conductive layer extending along the first side. The circuit board includes signal vias located along the first side. The signal vias are arranged to form multiple signal pairs. The signal vias are electrically isolated from the conductive layer. The circuit board also including ground vias that re located along the first side. The ground vias are positioned relative to the signal pairs to electrically shield the signal pairs from one another, wherein the conductive layer extends between and joins the ground vias, the conductive layer being exposed along the first side to engage an electrical component.

In certain aspects, the circuit board includes a mask layer that covers portions of the conductive layer. Exposed portions of the conductive layer may constitute contact areas. The contact areas may extend a wiping distance along the first side that permits grounding features to slide therealong.

BRIEF DESCRIPTION OF THE DRAWINGS

FIG. 2 is a perspective view of an electrical connector formed in accordance with one embodiment and a grounding matrix.

FIG. 3 is a representative view that illustrates an arrangement of terminals that may be used with the electrical connector of FIG. 2 and contact points that may occur in the connector assembly of FIG. 1.

DETAILED DESCRIPTION OF THE INVENTION

Embodiments described herein include circuit board assemblies, electrical connectors, and circuit boards that are configured to transmit communication signals (e.g., data signals). For example, one or more embodiments may include electrical connectors and connector assemblies having grounding features. Exemplary connector assemblies include two electrical components that are configured to engage each other and grounding features that are configured to establish a return path between the two electrical components. The grounding features may be located along an interface that exists between electrical components. In some embodiments, one electrical component is a receptacle connector or a header connector of a backplane system and the other electrical component is a corresponding circuit board having the connector mounted thereto. The grounding features may be located between the connector and the circuit board along the interface.

In certain embodiments, the grounding features include ground contacts that engage at least one of the surfaces of the electrical components. The ground contacts may be interconnected together in a web-like manner to form a grounding matrix. However, in other embodiments, the ground contacts are not interconnected and, instead, may be independently located on, for example, one of the electrical components. The ground contacts may include flex portions that move independently with respect to each other thereby allowing the electrical components to be electrically connected through multiple contact points.

Figure 1:
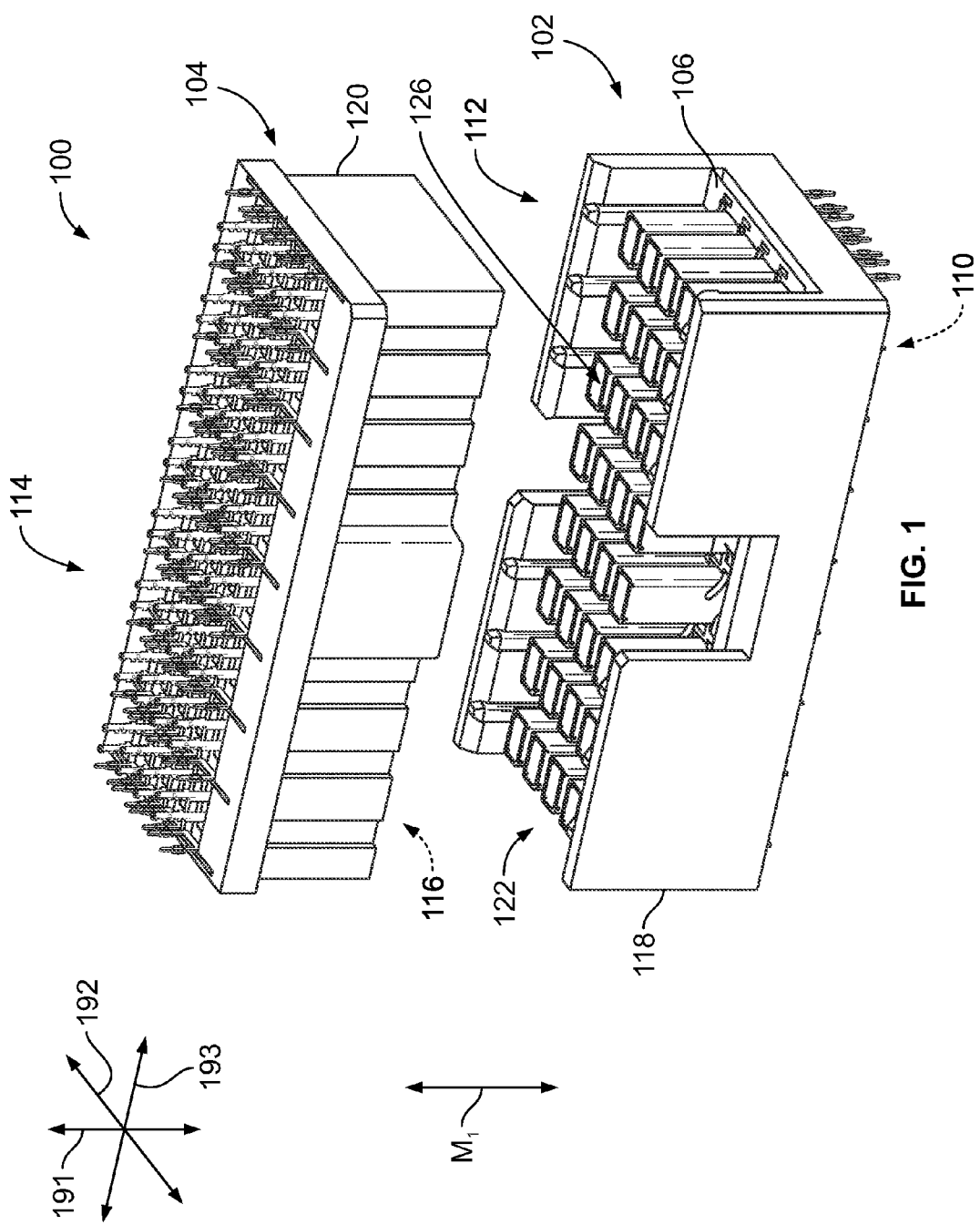
FIG. 1 illustrates a circuit board assembly foil led in accordance with one embodiment that includes grounding features.

FIG. 1 illustrates an electrical connector assembly 100 formed in accordance with an exemplary embodiment. The connector assembly 100 includes first and second electrical connectors 102, 104 and a grounding matrix 106 held by the electrical connector 102. In other embodiments, the electrical connector 104 may hold the grounding matrix 106. The electrical connectors 102, 104 are configured to engage each other and establish an electrical connection therebetween during a mating operation. The first electrical connector 102 may be referred to as a header connector of a backplane system, and the second electrical connector 104 may be referred to as a receptacle connector of the backplane system. However, it is understood that embodiments described herein may be used in various applications and are not limited to backplane systems. As shown, the connector assembly 100 is oriented with respect to mutually perpendicular axes 191-193 including a mating axis 191 and lateral axes 192, 193.

The electrical connector 102 has a mounting side 110 and an engagement side 112, and the electrical connector 104 also has a mounting side 114 and an engagement side 116. In the illustrated embodiment, the mounting and engagement sides 110, 112 face in opposite directions along the mating axis 191, and the mounting and engagement sides 114, 116 also face in opposite directions. As such, the electrical connectors 102, 104 may be characterized as vertical connectors. However, in alternative embodiments, the electrical connectors 102 and 104 may be right-angle connectors in which the respective mounting and engagement sides face in perpendicular directions with respect to each other. The mounting sides 110, 114 are configured to engage respective electrical components, such as circuit boards (not shown).

The electrical connector 102 includes a connector body or housing 118, and the electrical connector 104 includes a connector body 120. The connector bodies 118, 120 comprise conductive material (e.g., metal, a mold with conductive particles, and the like). The connector bodies 118, 120 may form a return path when the electrical connectors 102, 104 are mated. The electrical connector 102 includes electrical terminals 122 that are held by the connector body 118 in an array. The electrical connector 104 also includes electrical terminals (not shown). The electrical terminals of the electrical connector 104 may also be referred to as mating terminals. In an exemplary embodiment, the electrical connector 102 has a body-receiving cavity 126 that opens to the engagement side 112. The receiving cavity 126 is sized and shaped to receive the connector body 120.

During the mating operation, the receiving cavity 126 receives the engagement side 116. The electrical terminals 122 and the electrical terminals of the electrical connector 104 engage each other and establish the electrical connection. When the electrical connectors 102 and the electrical terminals of the electrical connector 104 are engaged, the grounding matrix 106 operates to electrically couple the connector bodies 118, 120 along a mating interface. In alternative embodiments, the engagement side 116 includes a receiving cavity and the engagement side 112 is configured to be received by the receiving cavity of the engagement side 116.

When the electrical connectors 102, 104 are mated, the electrical connectors 102, 104 are moved relatively toward each other along a mating direction $M_1$ that extends substantially parallel to the mating axis 191. The mating direction $M_1$ is indicated as being bi-directional because the electrical connector 102 may be moved toward the electrical connector 104 or vice versa. Furthermore, both of the electrical connectors 102, 104 can be moved toward each other at the same time. In an exemplary embodiment, the electrical terminals 122 and the electrical terminals of the electrical connector 104 slidably engage each other during the mating operation.

In an exemplary embodiment, the electrical connector 102 is a backplane connector and the electrical connector 104 is a daughter card connector. However, in alternative embodiments, the electrical connector 102 may be a daughter card connector and the electrical connector 104 may be a backplane connector. While the connector assembly 100 is described herein with reference to a backplane connector and a daughter card connector, it is realized that the subject matter herein may be utilized with different types of electrical connectors other than a backplane connector or a daughter card connector. The backplane connector and the daughter card connector are merely illustrative of an exemplary embodiment of the connector assembly 100. In particular embodiments, the connector assembly 100 transmits high-speed data signals. For example, the data signals may be transmitted at speeds greater than or equal to 15 Gbps. In more particular embodiments, the data signals may be transmitted at speeds greater than or equal to 20 Gbps or greater than or equal to 25 Gbps. However, in other embodiments, the connector assembly 100 may transmit data signals at slower speeds.

FIG. 2 is a perspective view of the electrical connector 102 and the grounding matrix 106. In an exemplary embodiment, the connector body 118 includes housing walls 128-131 and a conductive surface 132 that define the receiving cavity 126. The housing walls 128-131 project from the conductive surface 132 along the mating axis 191. The conductive surface 132 defines a depth $D_1$ of the receiving cavity 126 measured from edges of the housing walls 128-131. As shown, the receiving cavity 126 not only opens to the engagement side 112 in a direction along the mating axis 191 but also opens to the exterior of the electrical connector 102 in directions along the lateral axes 192, 193. More specifically, the housing walls 128-131 may have openings 138-141 therebetween that provide access to the receiving cavity 126 from the exterior. In some embodiments, one or more of the openings 138-141 complement features of the electrical connector 104 such that the features slide through the openings 138-141.

In an exemplary embodiment, the electrical terminals 122 constitute contact towers that project away from the conductive surface 132 along the mating axis. The electrical terminals 122 may also constitute socket contacts that have respective contact cavities 134 that are configured to receive the electrical terminals of the electrical connector 104. The electrical terminals 122 extend a height H from the conductive surface 132. The height H may be substantially equal to the depth $D_1$. As shown, the electrical terminals 122 have substantially equal heights H with respect to one another. In alternative embodiments, the heights H may be different.

FIG. 3 shows an arrangement of the electrical terminals 122 located on the conductive surface 132 (FIG. 2) according to an exemplary embodiment. As shown, the electrical terminals 122 are spaced apart from one another and positioned in an array along the conductive surface 132. In the illustrated embodiment, the electrical terminals 122 are arranged in rows and columns in the array. However, the array is not required to have linear rows or columns. Instead, the electrical terminals 122 can be located in any predetermined arrangement that is desired.

In the illustrated embodiment, adjacent terminals 122 may be separated by gaps 142 and by gaps 144. The gaps 142 extend generally along the lateral axis 192 (FIG. 1), and the gaps 144 extend generally along the lateral axis 193 (FIG. 1). Two terminals can be adjacent if no other terminal is located therebetween. As such, adjacent terminals 122 may also be separated by gaps 143 that extend diagonally with respect to the lateral axes 192, 193. The gaps 142-144 may collectively fault an interwoven reception region 146 that extends along the conductive surface 132 between the electrical terminals 122.

The reception region 146 may include first and second paths 148, 150 in which each of the first and second paths 148, 150 extends through a plurality of the gaps that separate the electrical terminals 122. The paths 148, 150 may extend continuously therethrough without being interrupted by walls or other projections extending from the conductive surface 132. As used herein, a reception region is interwoven when at least two of the paths extend along a plurality of corresponding terminals and intersect each other. For example, the reception region 146 includes the first path 148 that extends along corresponding terminals 122 through the gaps 142, 143 and also includes the second path 150 that extends along corresponding terminals 122 through the gaps 144, 143. Each of the first and second paths 148, 150 extends along a series of terminals 122.

In an exemplary embodiment, the first path 148 extends parallel to the lateral axis 193, and the second path 150 extends parallel to the lateral axis 192 such that the paths 148, 150 intersect each other in a perpendicular manner. Also in an exemplary embodiment, the reception region 146 may include a plurality of first paths 148 and a plurality of second paths 150 that intersect one another. In the embodiment shown in FIG. 3, the paths 148, 150 are substantially linear and perpendicular to each other. However, in alternative embodiments, the paths 148, 150 may be non-linear and/or may not extend perpendicular to each other.

As will be described in greater detail below, the solid dots 184 and the hollow dots 186 shown in FIG. 3 represent contact points where the grounding matrix 106 engages the electrical connectors 102, 104 (FIG. 1), respectively.

Returning to FIG. 2, in some embodiments, the grounding matrix 106 may be positioned within the receiving cavity 126 along the conductive surface 132. As shown, the grounding matrix 106 can have a substantially planar body or frame 136 that includes ground contacts 152 and linkages 154, 155 that interconnect the ground contacts 152 in a web-like manner. The ground contacts 152 and the linkages 154, 155 may form openings 156. When the grounding matrix 106 is positioned within the reception region 146, the ground contacts 152 and linkages 154 may be located in at least some of the gaps 142-144 (FIG. 3) and paths 148, 150 (FIG. 3). The electrical terminals 122 may advance through the openings 156.

In an exemplary embodiment, the grounding matrix 106 is stamped-and-formed from a layer of sheet material. The grounding matrix 106 may be conductive throughout. However, the grounding matrix 106 can be formed in different manners in other embodiments. For example, in one alternative embodiment, the grounding matrix may include an organizer that holds separate ground contacts. The organizer may include the linkages.

As shown, the grounding matrix 106 may include edge members 160 along an outer perimeter of the grounding matrix 106. In one embodiment, the edge members 160 can be outwardly projecting tabs as shown in FIG. 2. The housing walls 128-131 may include interior slots or grooves 158 that are configured to receive the edge members 160. When the grounding matrix 106 is deposited into the reception region 146, the edge members 160 frictionally engage the slots 158. In some embodiments, the grounding matrix 106 is floatably coupled to the electrical connector 102 such that the grounding matrix 106 is movable with respect to the connector body 118. For example, the grounding matrix 106 can be at least floatable along the mating axis 191 toward and away from the conductive surface 132.

Figure 4:
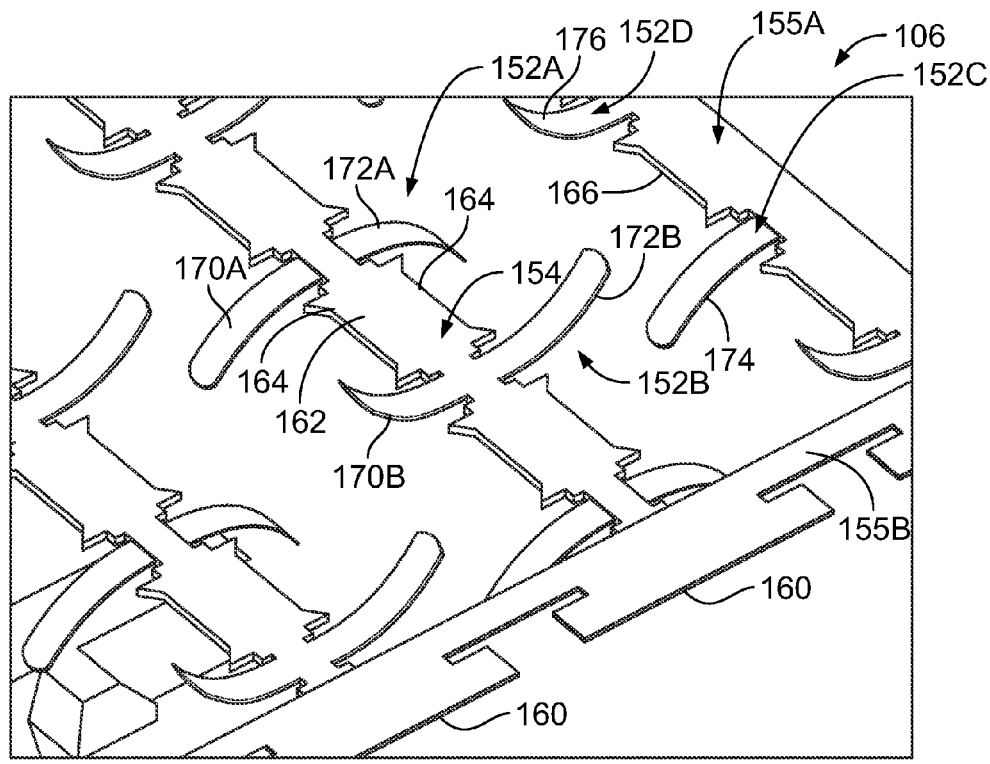
FIG. 4 is an enlarged perspective view of a portion of the grounding matrix that may be used with the electrical connector of FIG. 2.

FIG. 4 is an enlarged perspective view of a portion of the grounding matrix 106 showing the ground contacts 152 and the linkages 154, 155 in greater detail. The linkages include inner linkages 154, end linkages 155A, and side linkages 155B. The end and side linkages 155A, 155B define a perimeter of the grounding matrix 106. As shown, the inner linkages 154 join adjacent ground contacts 152A and 152B. Thus, the inner linkages 154 may be characterized as inter-contact linkages. The inner linkages 154 have a linkage body 162 with contoured edges 164. The body 162 is sized and shaped to be positioned within a corresponding gap 144 (FIG. 3) between adjacent terminals 122 (FIG. 1). The edges 164 may be shaped to extend along an exterior surface of the corresponding terminal 122. In some embodiments, the inner linkages 154 may prevent movement of the grounding matrix 106 in a direction along a plane defined by the lateral axes 192, 193 (FIG. 1). In some embodiments, the inner linkages 154 may also improve the shielding abilities of the connector assembly 100 (FIG. 1).

As shown in FIG. 4, the end linkage 155A joins adjacent ground contacts 152C and 152D. The side linkages 155B also include the edge members 160 extending outward therefrom. In an exemplary embodiment, the end and side linkages 155A, 155B surround the ground contacts 152. The end linkages 155A may also have contoured edges 166 that are configured to extend along an exterior surface of the corresponding terminal 122.

Figure 5:
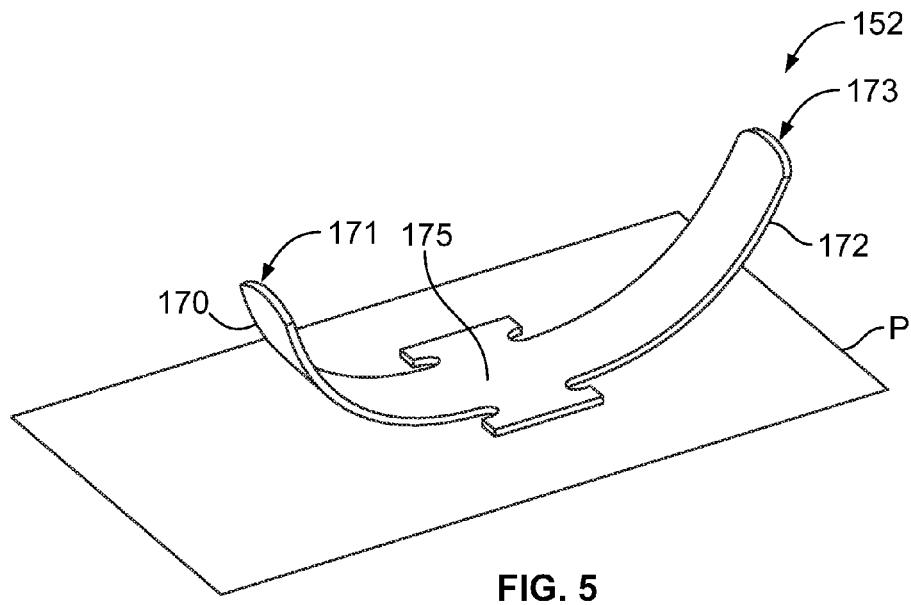
FIG. 5 is an isolated view of an exemplary embodiment of a ground contact that may be used with the grounding matrix.

FIG. 5 is an isolated view of an exemplary embodiment of the ground contact 152. Optionally, ground contacts described herein may include one or more flex portions that extend away from or toward the conductive surface 132 (FIG. 2). For example, the ground contact 152 shown in FIG. 5 has first and second flex portions 170, 172 and a contact base 175 that joins the flex portions 170, 172. The contact base 175 may be located within and extend along a contact plane P. The contact plane P may extend parallel to a plane defined by the lateral axes 192, 193 (FIG. 1). The flex portions 170, 172 extend from the contact base 175 in opposite directions away from each other to respective distal ends 171, 173. The flex portions 170, 172 also extend away from the contact plane P. In the illustrated embodiment, the flex portions 170, 172 curve or curl in the same direction away from the contact plane P. As such, the ground contact 152 may be substantially C-shaped or cup-shaped.

However, in other embodiments, the flex portions 170, 172 may have different shapes. For example, the ground contact 152 may have an overall V-shape or the ground contact 152 may have no curve and extend in a linear manner. One of the flex portions may extend in one direction away from the contact plane P, and the other flex portion may extend in an opposite direction away from the contact plane P. Also, in alternative embodiments, the grounding matrix 106 may not include the flex portions 170, 172. In such embodiments, the grounding matrix 106 may include only linkages, such as the inner linkages 154 and the end and side linkages 155A, 155B.

Returning to FIG. 4, the ground contacts 152 may have different features or characteristics with respect to one another. For example, the grounding matrix 106 may include different ground contacts 152A-D. The ground contacts 152A include flex portions 170A, 172A that extend toward the conductive surface 132 when the grounding matrix 106 is properly positioned. The ground contacts 152B include flex portions 170B, 172B that extend away from the conductive surface 132. The ground contacts 152C and 152D each include a single flex portion 174, 176, respectively. The flex portions 174, 176 extend toward and away from the conductive surface 132, respectively.

Figure 6:
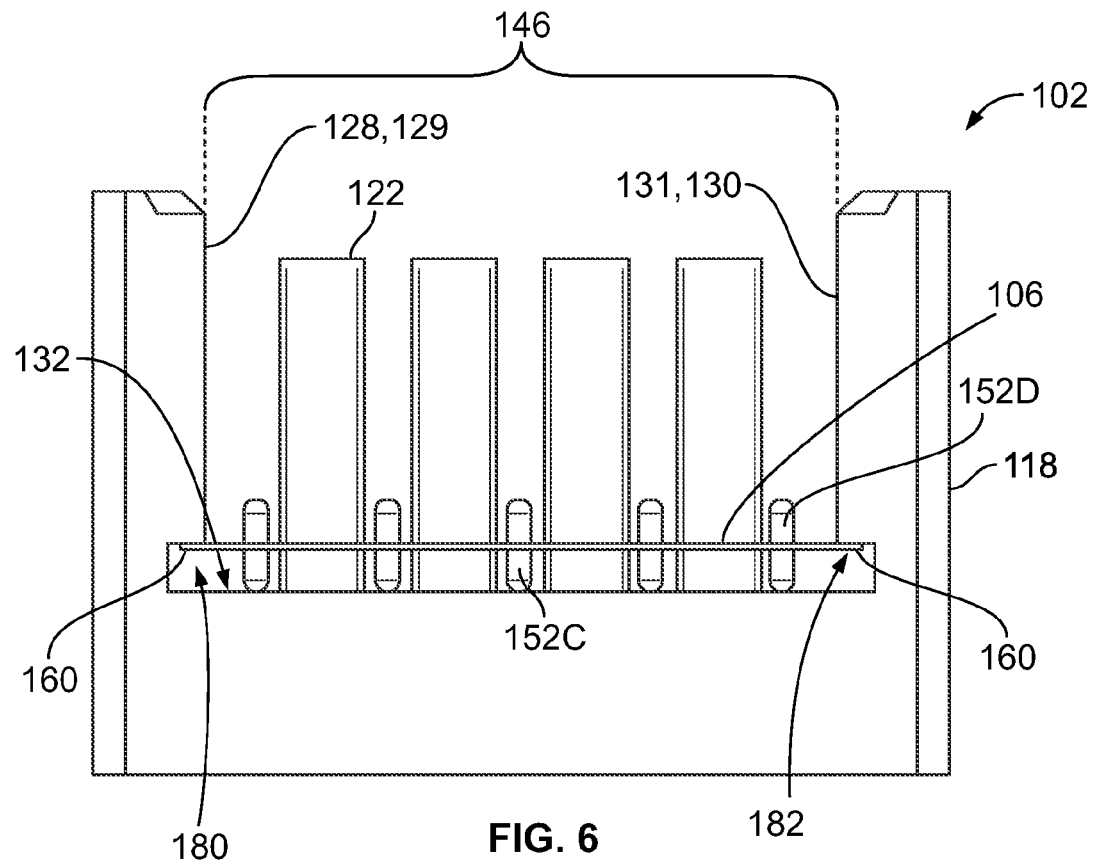
FIG. 6 is a side view of the electrical connector having the grounding matrix positioned within an interwoven reception region.
Figure 7:
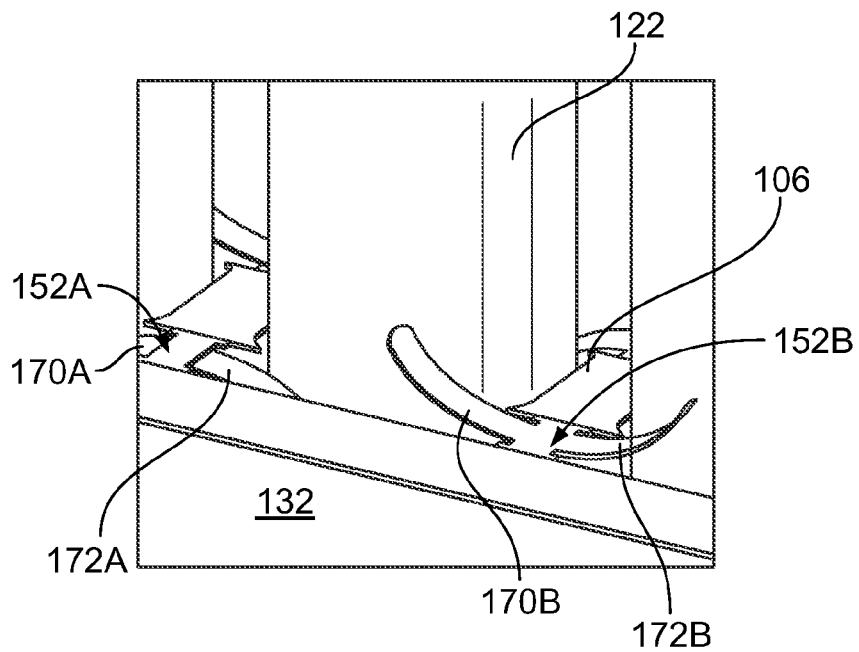
FIG. 7 is an enlarged perspective view showing the grounding matrix in greater detail.

FIG. 6 is a side view of the electrical connector 102 having the grounding matrix 106 positioned within the reception region 146, and FIG. 7 is an enlarged perspective view showing the grounding matrix 106 and the conductive surface 132 in greater detail. As shown in FIG. 6, the connector body 118 has a pair of channels 180, 182 that extend through the connector body 118. The channels 180, 182 may be defined between the conductive surface 132 and the housing walls 128-131. The channels 180, 182 are configured to receive corresponding edge members 160 when the grounding matrix 106 is positioned within the reception region 146. During insertion of the grounding matrix 106 into the reception region 146, the edge members 160 may be partially deflected by the housing walls 128-131. The edge members 160 may resile back into a non-deflected position after entering the channels 180, 182, and clearing the housing walls 128-131.

With respect to FIGS. 6 and 7, the ground contacts 152A (FIG. 7), 152C (FIG. 6) engage the conductive surface 132 and the ground contacts 152B (FIG. 7), 152D (FIG. 6) extend away from the conductive surface 132. A plurality of the ground contacts 152 are located adjacent to one or more of the electrical terminals 122, and a plurality of the ground contacts 152 are located between two terminals 122. During the mating operation, the ground contacts 152A, 152C are configured to initially engage the conductive surface 132 and the ground contacts 152B, 152D are configured to initially engage a corresponding conductive surface (not shown) of the mating connector 104 (FIG. 1). Accordingly, the grounding matrix 106 engages each of the conductive surfaces thereby establishing an electrical connection between the connector bodies 118, 120 (FIG. 1).

In an exemplary embodiment, the grounding matrix 106 engages the connector body 120 at a plurality of contact points 184 (shown as solid dots in FIG. 3) where the flex portions 170B, 172B (FIG. 7) contact the conductive surface (not shown) of the electrical connector 104 (FIG. 1). The grounding matrix 106 also engages the connector body 118 at a plurality of contact points 186 (shown as hollow dots in FIG. 3) where the flex portions 170A, 172A (FIG. 7) contact the conductive surface 132. In particular embodiments, the ground contacts 152A and 152B alternate in the array such that for each ground contact 152A that engages the conductive surface 132, the adjacent ground contacts 152B engage the conductive surface (not shown) of the electrical connector 104 and for each ground contact 152B that engages the conductive surface of the electrical connector 104, the adjacent ground contacts 152A engage the conductive surface 132.

The inner linkages 154, the end linkages 155A, the side linkages 155B, and the ground contacts 152 are part of the same stamped-and-formed sheet material. However, in alternative embodiments, the ground contacts 152 may be indirectly coupled to each other through, e.g., an organizer or interposer. For instance, the organizer could include a planar dielectric body having holes configured to receive one or more ground contacts 152 and openings configured to receive the electrical terminals 122. In other embodiments, the ground contacts 152 may be entirely independent from each other such that each ground contact 152 is separately positioned within the reception region 146.

Figure 8:
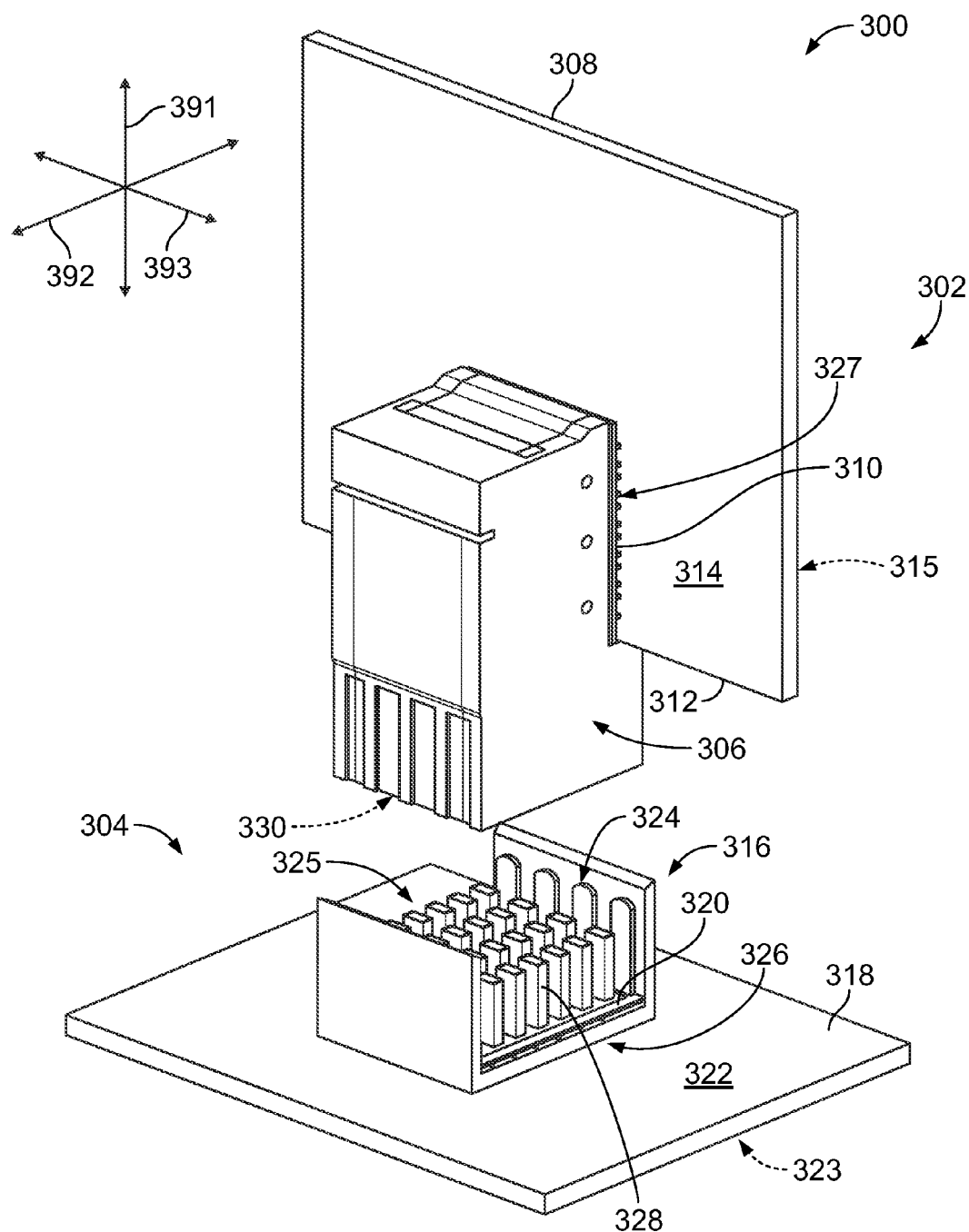
FIG. 8 is a perspective view of a communication system in accordance with an embodiment.

FIG. 8 illustrates a communication system 300 that includes a circuit board assembly 302 and a circuit board assembly 304 that are configured to engage each other during a mating operation. The communication system 300 is oriented with respect to mutually perpendicular axes 391-393, including a mating axis 391 and lateral axes 392, 393. As shown, the circuit board assembly 302 includes an electrical connector 306 (hereinafter referred to as a receptacle connector 306), a circuit board 308, and a grounding matrix 310. The circuit board 308 includes a leading edge 312 and opposite first and second sides 314, 315. The first side 314 is hereinafter referred to as the engagement side 314. The receptacle connector 306 is mounted to the engagement side 314 along the leading edge 312.

Also shown, the circuit board assembly 304 includes a header connector 316, a circuit board 318, and a grounding matrix 320. The circuit board 318 has opposite first and second sides 322, 323. The first side 322 is hereinafter referred to as the engagement side 322. Although not shown in FIG. 8, the circuit board assembly 304 also includes a grounding matrix 321 (shown in FIG. 14) between the header connector 316 and the circuit board 318.

The grounding matrix 310 is located along a mounting interface 327 between the circuit board 308 and the receptacle connector 306. Likewise, the grounding matrix 321 is located along a mounting interface 326 between the circuit board 318 and the header connector 316. When the receptacle and header connectors 306, 316 are engaged, the grounding matrix 320 may be located along a mating interface (not shown) between the receptacle and header connectors 306, 316.

As set forth herein, the grounding matrices 310, 320, and 321 are configured to establish multiple contact points between two components along a corresponding interface so that a ground or return path is maintained during operation. For example, the grounding matrix 310 is configured to provide multiple contact points along the mounting interface 327. The grounding matrix 321 is configured to provide multiple contact points along the mounting interface 326. Similar to the grounding matrix 106 (FIG. 1), the grounding matrix 320 is configured to provide multiple contact points along the interface between the receptacle and header connectors 306, 316. The grounding matrices 310, 320, and 321 may improve the electrical performance (e.g., improve the communication of data signals) between the corresponding mated components.

The header connector 316 has a mating side 324 that includes electrical terminals 325 disposed therealong. Each of the electrical terminals 325 includes a contact housing 328 that surrounds a corresponding pair of electrical contacts (not shown). The receptacle connector 306 also has a mating side 330 that includes socket cavities (not shown) that each include a pair of electrical contacts (not shown) therein. During the mating operation, the mating side 330 of the receptacle connector 306 is advanced toward the mating side 324 of the header connector 316. The electrical terminals 325 are received by corresponding socket cavities of the receptacle connector 306 and advanced into the socket cavities until the contacts of the electrical terminals and the contacts in the socket cavities engage each other. During the mating operation, the grounding matrix 320 may be compressed by and between the receptacle and header connectors 306, 316 thereby establishing a ground path.

The communication system 300 may be used in various applications. By way of example, the communication system 300 may be used in telecom and computer applications, routers, servers, supercomputers, and uninterruptible power supply (UPS) systems. In such embodiments, the circuit board assembly 302 may be described as a daughter card assembly and the circuit board assembly 304 may be described a backplane connector assembly. The receptacle and header connectors 306, 316 may be similar to electrical connectors of the STRADA Whisper or Z-PACK TinMan product lines developed by TE Connectivity. In some embodiments, the receptacle and header connectors 306, 316 are capable of transmitting data signals at high speeds, such as 10 Gbps, 20 Gbps, or more. Although the communication system 300 is illustrated as a backplane system, embodiments are not limited to such systems and may be used in other types of communication systems. As such, the receptacle and header connectors 306, 316 may be referred to more generally as electrical connectors.

Figure 9:
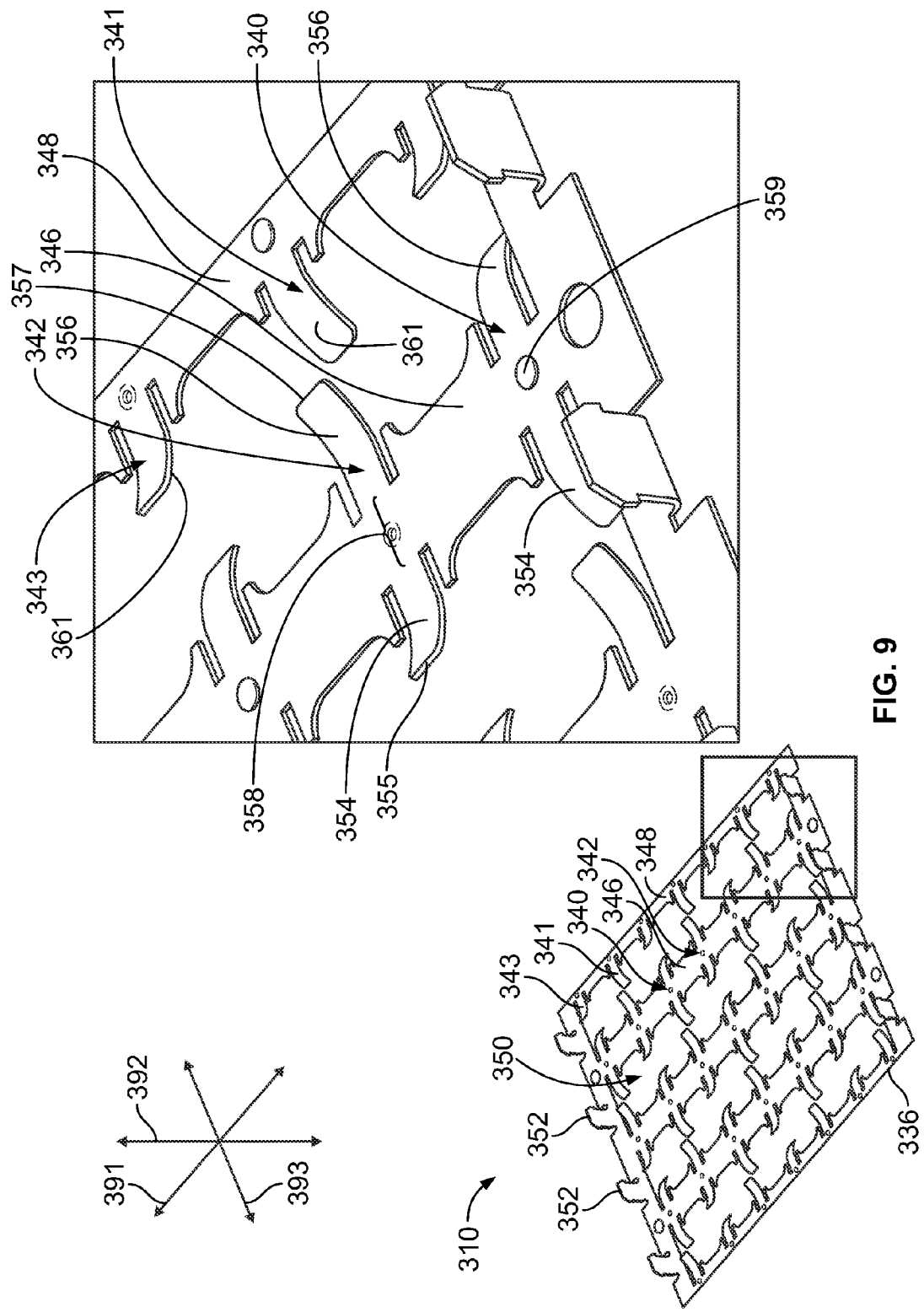
FIG. 9 illustrates a perspective view of a grounding matrix formed in accordance with one embodiment.

FIG. 9 illustrates an isolated perspective view of the grounding matrix 310 as well as an enlarged portion of the grounding matrix 310. Although the following description is with respect to the grounding matrix 310, the grounding matrix 320 (FIG. 8) and the grounding matrix 321 (FIG. 14) may have similar or identical features as the grounding matrix 310. The grounding matrix 310 may be similar to the grounding matrix 106 (FIG. 1). For example, as shown in FIG. 9, the grounding matrix 310 can have a substantially planar body or frame 336 that includes ground contacts 340-343 and linkages 346, 348 that interconnect the ground contacts 340-343 in a web-like manner. The ground contacts 340-343 and the linkages 346, 348 form openings 350.

The grounding matrix 310 is formed from conductive material. Non-limiting examples of materials that may be used to form the grounding matrix 310 include metal, a conductive elastomer, an elastomer coated with a conductive material, conductive tape, and the like. In the illustrated embodiment, the grounding matrix 310 is stamped-and-formed from sheet metal and is conductive throughout. However, the grounding matrix 310 can be formed in different manners in other embodiments. For example, in one alternative embodiment, the grounding matrix may include an organizer comprising a dielectric frame that holds the ground contacts. In some cases, at least some of these ground contacts may be electrically isolated from others.

As shown, the grounding matrix 310 may include attachment features 352 along an outer perimeter of the grounding matrix 310. In some embodiments, the attachment features 352 can be projections or tabs that extend in a direction that is orthogonal to a plane defined by the grounding matrix 310. For example, the frame 336, portions of the ground contacts 340-343, and the linkages 346, 348 may coincide within a ground plane that is parallel to the mating and lateral axes 391, 393 in FIG. 9. The attachment features 352 may extend in a direction that is parallel to the lateral axis 392. The attachment features 352 are configured to directly engage and couple to the receptacle connector 306 (FIG. 8) to secure the grounding matrix 310 to the receptacle connector 306.

In some embodiments, the grounding matrix 310 is floatably coupled to the receptacle connector 306 such that the grounding matrix 310 is permitted to move relative to the receptacle connector 306 within a restricted space. In other embodiments, the grounding matrix 310 may directly engage and couple to the circuit board 308 (FIG. 8) or, alternatively, may not couple to either the circuit board 308 or the receptacle connector 306.

The enlarged portion of FIG. 9 illustrates the ground contacts 340-343 and the linkages 346, 348 in greater detail. The linkages 346 are configured to directly connect the ground contacts 340, 342 to one another. For example, the linkages 346 join adjacent ground contacts 340, 342 in FIG. 9. The linkages 348 extend along a perimeter of the grounding matrix 310 and join adjacent ground contacts, such as the ground contacts 341, 343.

Similar to the ground contacts 152 (FIG. 2), the ground contacts described herein may include one or more flex portions that extend out of a ground plane defined by the grounding matrix 310. For example, the ground contact 342 has first and second flex portions 354, 356 and a contact base 358 that joins the flex portions 354, 356. The flex portions 354, 356 extend from the contact base 358 in opposite directions away from each other to respective distal ends 355, 357 disposed at a distance from one side of the ground plane. The ground contact 340 also has flex portions 354, 356. However, the flex portions 354, 356 of the ground contact 340 extend in an opposite direction from the ground plane as compared to the flex portions 354, 356 of the ground contact 342.

In the illustrated embodiment, the flex portions 354, 356 may have a curved or curled contour such that the flex portions 354, 356 from a single ground contact extend in the same direction away from the ground plane. As such, the ground contacts 340, 342 may be substantially C-shaped. Also shown in FIG. 9, the ground contacts 341, 343 may have only a single flex portion 361 that is similarly shaped as the flex portions 354, 356. The flex portions 361 of the ground contacts 341, 343 may extend in generally opposite directions from the ground plane.

In some embodiments, the contact bases 358 include a base projection 359. The base projection 359 is shaped similar to a button in FIG. 9, but may have other shapes in alternative embodiments. The base projection 359 extends from the ground plane in a direction opposite the direction that the flex portions 354, 356 extend and, in operation, is configured to engage an electrical component. For example, if the flex portions 354, 356 extend toward the receptacle connector 306 (FIG. 8), the base projection 359 may extend toward and directly engage the circuit board 308 (FIG. 8). If the flex portions 354, 356 extend toward the circuit board 308, the base projection 359 may extend toward and directly engage the receptacle connector 306.

Figure 10:
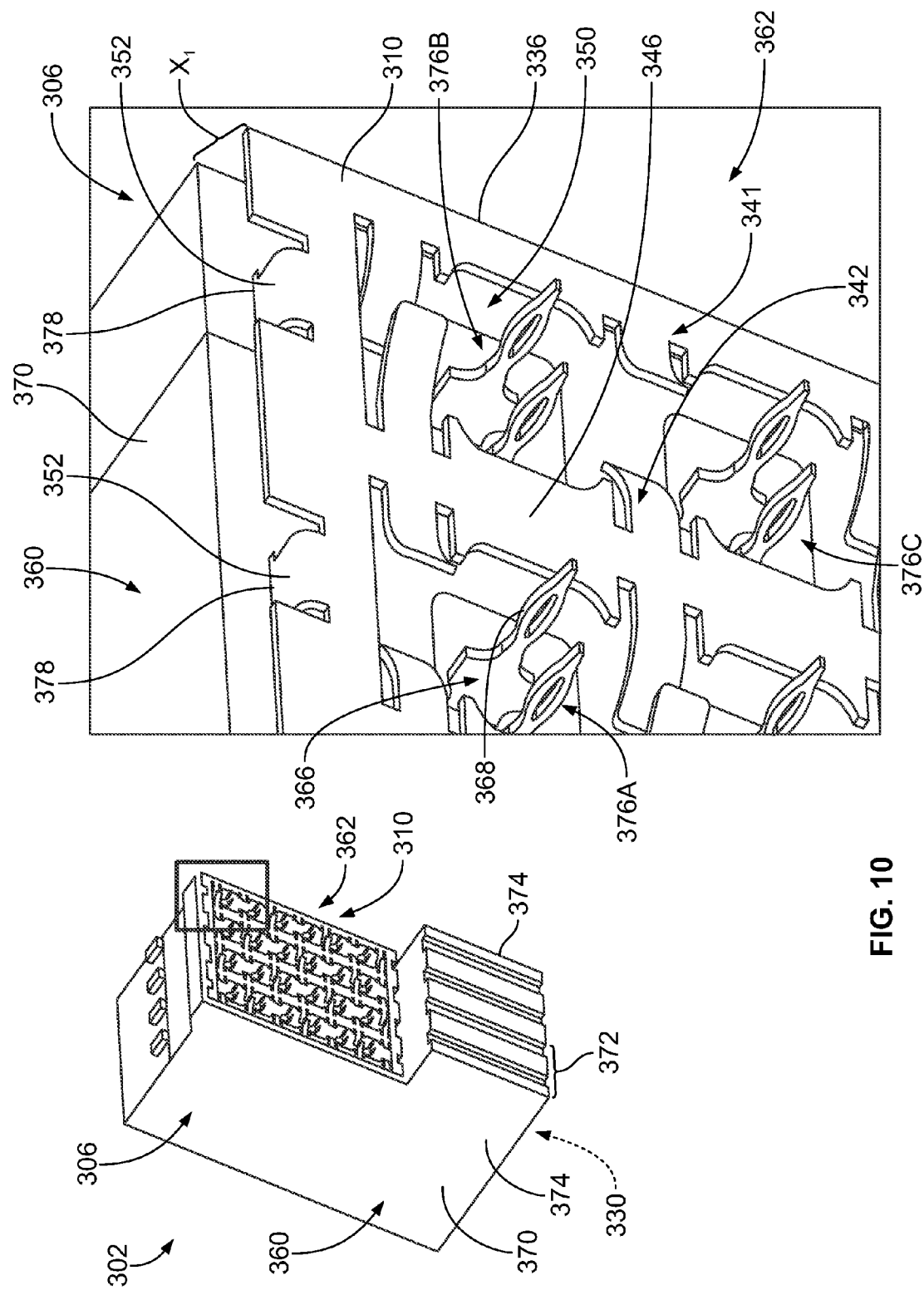
FIG. 10 is a bottom perspective view of a receptacle connector having the grounding matrix of FIG. 9 positioned along a mounting side of the receptacle connector.

FIG. 10 includes a bottom perspective view of a portion of the circuit board assembly 302 and, in particular, the receptacle connector 306. The receptacle connector 306 includes a connector body 360 having a mounting side 362 and the mating side 330. The mounting side 362 is configured to be mounted to the circuit board 308 (FIG. 8) with the grounding matrix 310 therebetween. The connector body 360 may be constructed from dielectric and conductive materials. For example, the connector body 360 includes a conductive (e.g., metallized) housing 370 that is formed from a plurality of module housings 372 and housing shields 374. In the illustrated embodiment, the conductive housing 370 includes three of the module housings 372, which are stacked side-by-side and located between a pair of the housing shields 374. Each of the module housings 372 and the housing shields 374 may include a conductive material for grounding the circuit board assembly 302. For instance, the housing shields 374 may be stamped-and-formed from sheet metal and the module housings 372 may include metallized exterior surfaces.

An enlarged portion of the mounting side 362 is also shown in FIG. 10. The receptacle connector 306 includes signal conductors 366 that are held by the connector body 360. As shown, the signal conductors 366 have signal contacts (or contact tails) 368 that project from the mounting side 362. The signal contacts 368 are configured to mechanically and electrically engage plated thru-holes (not shown) of the circuit board 308 (FIG. 8).

As shown, the signal contacts 368 extend through the openings 350 of the grounding matrix 310. For example, the signal contacts 368 form signal pairs 376A-376C. Each signal pair 376A-376C extends through one of the openings 350. As such, adjacent signal pairs are separated and electrically shielded from each other by portions of the grounding matrix 310. For example, the adjacent signal pairs 376A and 376B are separated from each other by one of the linkages 346, and the adjacent signal pairs 376B and 376C are separated from each other by the ground contacts 341 and 342.

Also shown in FIG. 10, the attachment features 352 may extend into corresponding feature cavities or openings 378 of the connector body 360 and directly engage the connector body 360. In particular embodiments, the attachment features 352 form an interference fit or frictional engagement with surfaces of the connector body 360 that define the feature cavities 378. As such, the frame 336 may be held at a designated position that is spaced apart from the mounting side 362 by a separation distance $X_1$. In other embodiments, the attachment features 352 may grip exterior sides of the connector body 360. In various embodiments, the surface(s) of the connector body 360 that directly engage the attachment features 352 may be conductive such that ground pathways are formed through the attachment features 352.

In the illustrated embodiment, the attachment features 352 are stamped and formed with the frame 336 and ground contacts. However, in other embodiments, the attachment features 352 may be discrete elements that interconnect the frame 336 and the connector body 360. For example, the attachment features 352 may be separate fasteners (e.g., clips, plugs, or other hardware) that attach the frame 336 of the grounding matrix 310 to the connector body 360.

In some embodiments, the grounding matrix 310 may be permitted to float relative to the mounting side 362. For example, the grounding matrix 310 may be permitted to float to and from the mounting side 362 and/or to float laterally such that the frame 336 moves parallel to the mounting side 362. To this end, the attachment features 352 may be sized and shaped relative to the feature cavities 378 such that the attachment features 352 are permitted to move within the feature cavities 378.

Figure 11:
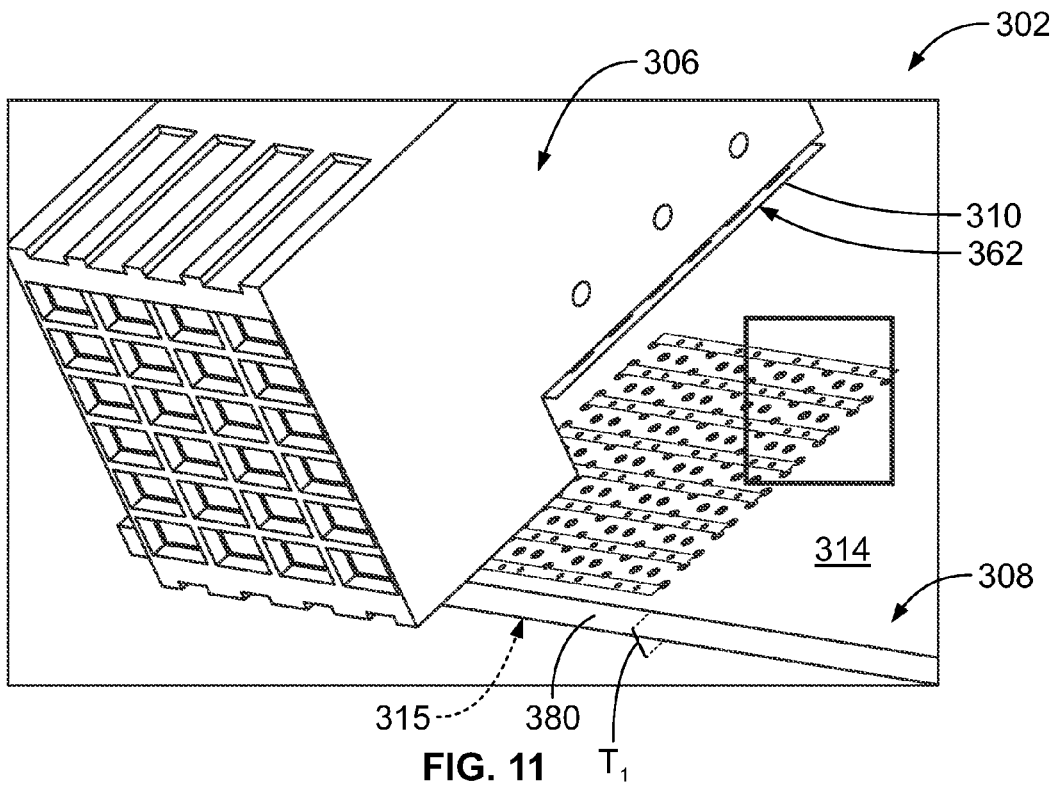
FIG. 11 is a top perspective view of a circuit board assembly that may be used with the communication system of FIG. 8.

FIG. 11 is a top perspective view of the circuit board assembly 302 before the receptacle connector 306 is mounted to the circuit board 308. As shown, the grounding matrix 310 is positioned along the mounting side 362. The circuit board 308 includes a board substrate 380 that has the engagement side 314 and the opposite side 315. The board substrate 380 has a thickness $T_1$ that is measured perpendicular to the sides 314, 315.

Figure 12:
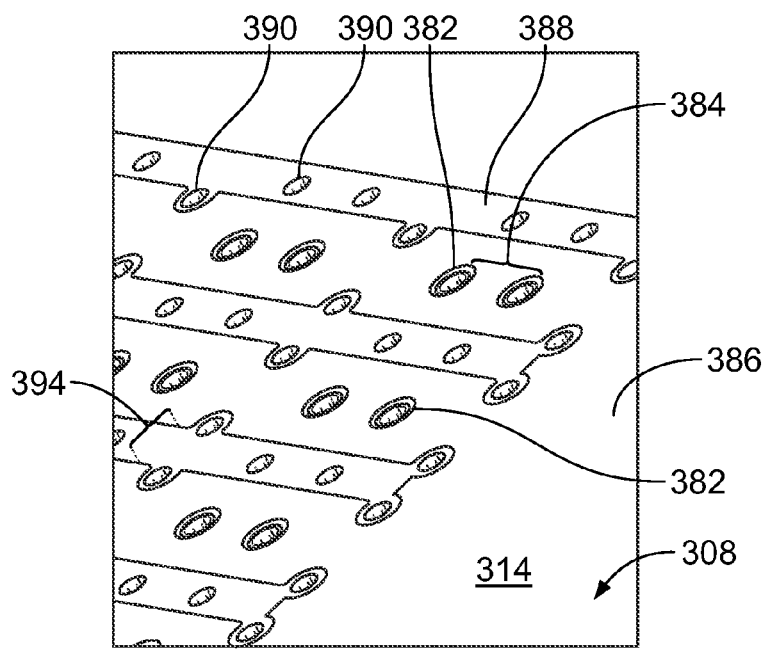
FIG. 12 is an enlarged view of a circuit board that may be used with the circuit board assembly of FIG. 11.

FIG. 12 shows an enlarged portion of the circuit board 308 that is outlined in the box of FIG. 11. As shown, the circuit board 308 includes signal vias 382 that are exposed along the engagement side 314. The signal vias 382 may be arranged to form multiple signal pairs 384. The circuit board 308 also includes ground vias 390 along the engagement side 314. As described below, in certain embodiments, the ground vias 390 are positioned relative to the signal vias 382 to electrically shield the signal vias 382 from one another. In embodiments that are configured to transmit differential signals, the ground vias 390 are positioned relative to the signal pairs 384 to electrically shield the signal pairs 384 from one another.

The circuit board 308 includes a conductive layer 388 and, optionally, a mask layer 386 that is located on top of the conductive layer 388. As shown, the signal vias 382 are electrically isolated from the conductive layer 388. For instance, portions of the conductive layer 388 may be removed (e.g., etched) so that the conductive layer 388 does not connect to the signal vias 382. The conductive layer 388 may electrically join at least some of the ground vias 390. In addition, the mask layer 386 may be patterned such that portions of the conductive layer 388 are exposed along the engagement side 314 and capable of engaging the ground contacts 340, 342 of the grounding matrix 310 (FIG. 9) as well as the ground contacts 341, 343 (FIG. 9). The exposed portions may be referred to as contact areas 394 and may be sized and shaped relative to the corresponding ground contacts that engage the contact areas 394.

Figure 13:
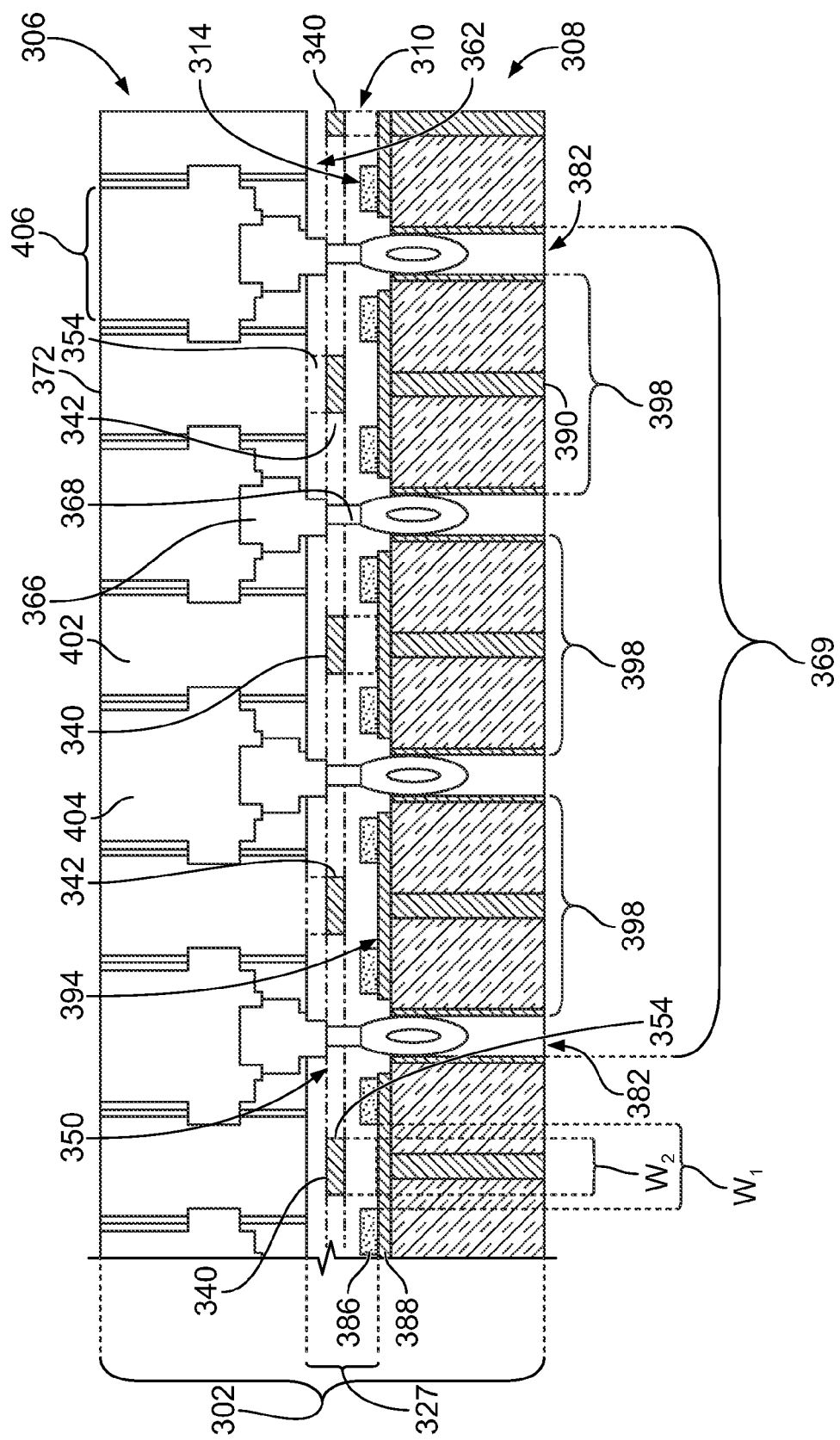
FIG. 13 is a side cross-section of the receptacle connector of FIG. 10 mounted to the circuit board of FIG. 11.

FIG. 13 is a side cross-section of the receptacle connector 306 mounted to the circuit board 308. In particular embodiments, the signal vias 382 are plated thru-holes (PTHs), and the ground vias 390 are microvias. Microvias may be blind vias and have diameters that are typically smaller than diameters of the signal vias 382. For instance, the diameters of the microvias may be less than 0.4 mm. Microvias may be manufactured through various processes, such as those that are used to manufacture blind vias. For example, microvias may be fabricated in one or more dielectric layers through mechanical drilling or laser drilling (e.g., using UV or CO2 lasers to provide a bore through the dielectric layer). Microvias may also be photo-defined or etched (e.g., chemical (wet) etching or plasma etching) blind vias. Once the microvias are formed, the dielectric layers may then be laminated with other dielectric layers that have (or will have) microvias. In this manner, the microvias from the different dielectric layers may be effectively stacked together such that the microvias are substantially end-to-end and form columns. U.S. patent application Ser. No. 13/493,632 ("the '632 Application") describes circuit boards having ground columns that may include microvias. Such circuit boards may include the conductive layer 388 and the mask layer 386 described herein. The '632 Application is incorporated herein by reference in its entirety.

As shown in FIG. 13, the grounding matrix 310 extends along the mounting interface 327 that is defined between the receptacle connector 306 and the circuit board 308. The flex portions 354 of the ground contacts 342 extend toward the mounting side 362 of the receptacle connector 306. Such ground contacts 342 may be described as inward-extending contacts. The flex portions 354 of the ground contacts 340 extend away from the mounting side 362 toward the engagement side 314 of the circuit board 308. Such ground contacts 340 may be described as outward-extending contacts.

The signal contacts 368 form an array 369 that includes gaps 398, which may be similar to the gaps 142-144 (FIG. 3). As shown, each gap 398 extends between adjacent signal contacts 368. Before or during the mounting operation, the receptacle connector 306 may be coupled to the grounding matrix 310. The signal contacts 368 may be advanced through the openings 350 and the ground contacts 340, 342 may be positioned within corresponding gaps 398.

FIG. 13 illustrates a cross-section of one of the module housings 372. As shown, the module housing 372 includes a conductive body material 402 and dielectric ribs 404. The body material 402 defines channels 406 through which the dielectric ribs 404 extend. For example, the dielectric ribs 404 may extend continuously from the mounting side 362 to proximate to the mating side 330 (FIG. 8). Each of the dielectric ribs 404 holds one of the signal conductors 366. The dielectric ribs 404 may be applied to the signal conductors 366 through, for example, an overmolding process. When the receptacle connector 306 is mounted to the circuit board 308, the ground contacts 340 directly engage the contact areas 394 of the conductive layer 388, and the ground contacts 342 directly engage the body material 402. As shown, the contact areas 394 may have a width $W_1$ that is greater than a width $W_2$ of the ground contact 340 to ensure that the ground contacts 340 will engage the conductive layer 388 without riding on the mask layer 386.

The ground contacts 340, 342 resiliently flex with respect to the mounting side 362 or the engagement side 314 when the receptacle connector 306 is mounted to the circuit board 308. With the ground contacts 340, 342 directly engaging the engagement and mounting sides, 314, 362, respectively, the grounding matrix 310 establishes at least one ground pathway through the grounding matrix 310 between the receptacle connector 306 and the circuit board 308. Ground pathways may also be formed through the conductive body material 402 of the receptacle connector 306 and the ground vias 390 of the circuit board 308.

As shown in FIG. 13, the signal contacts 368 directly engage the signal vias 382. More specifically, the signal contacts 368 frictionally engage interior surfaces of the signal vias 382. Collectively, these frictional engagements provide a retention force. In some embodiments, the retention force is greater than a separation force exerted by the ground contacts 340, 342. In other embodiments, additional elements, such as fasteners, may be used to attach the receptacle connector 306 to the circuit board 308.

During the mounting operation, the signal contacts 368 are inserted into corresponding signal vias 382 of the circuit board 308. As the signal contacts 368 are advanced into the signal vias 382, the ground contacts 340, 342 are compressed such that the flex portions 354 and the flex portions 356 (not shown) are moved toward the mounting side 362. The resilient nature of the flex portions 354, 356 permits the flex portions 354, 356 to independently flex with respect to the mounting side 362. In other words, each of the flex portions 354, 356 may be deflected more or less than other flex portions 354, 356. As such, multiple contact points between the grounding matrix 310 and the engagement side 314 and multiple contact points between the grounding matrix 310 and the mounting side 362 may be formed and sustained throughout operation of the circuit board assembly 302.

Figure 14:
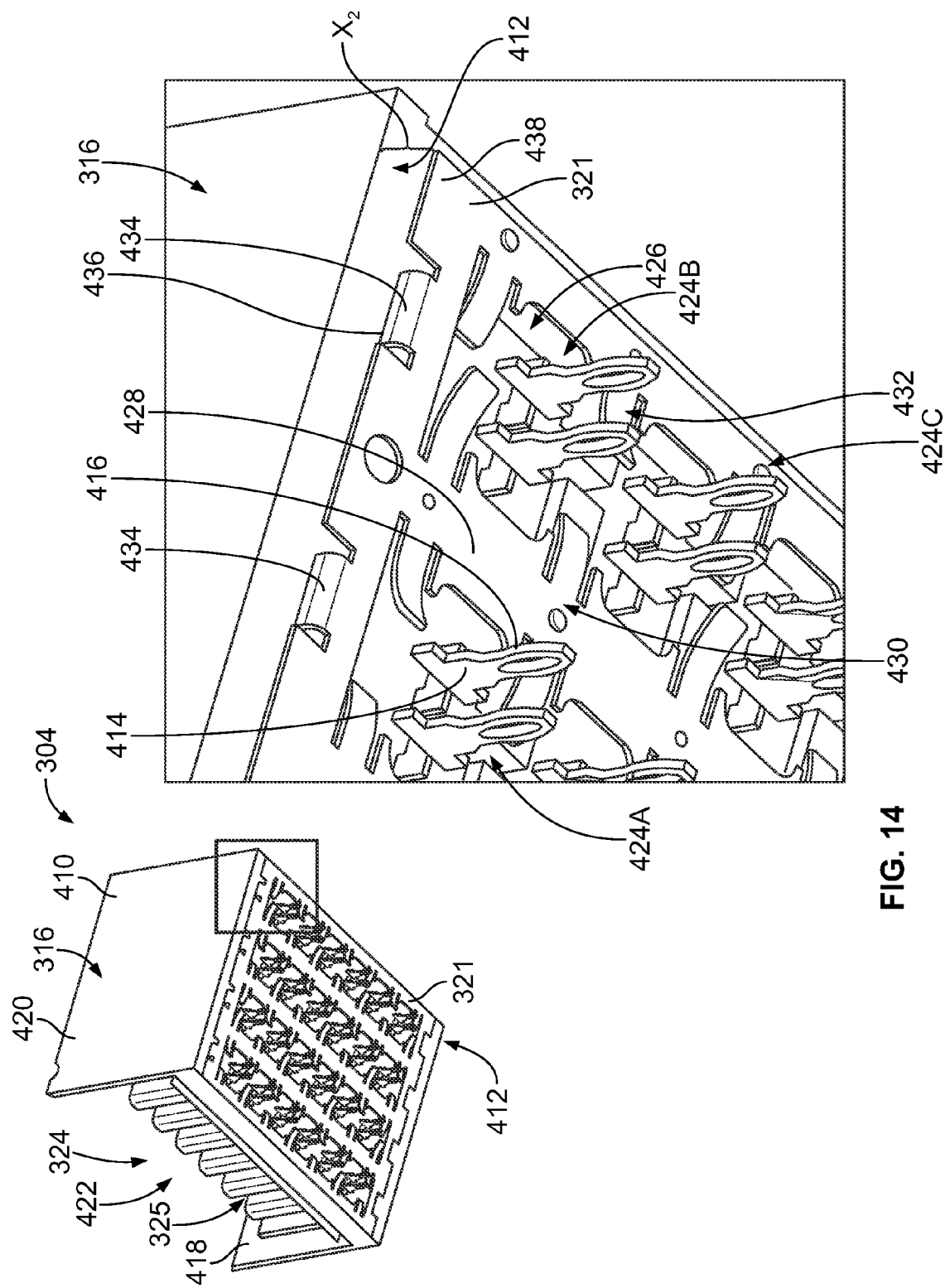
FIG. 14 is a bottom perspective view of a header connector having a grounding matrix positioned along a mounting side of the header connector.

FIG. 14 includes a bottom perspective view of a portion of the circuit board assembly 304 and, in particular, the header connector 316 and the grounding matrix 321. The header connector 316 includes a connector body 410 having a mounting side 412 and the mating side 324. The mounting and mating sides 412, 324 face in opposite directions. The connector body 410 includes a pair of housing walls 418, 420 that project from the mating side 324 in a direction parallel to the electrical terminals 325. The housing walls 418, 420 define a connector-receiving region 422 therebetween. The connector-receiving region 422 is sized and shaped to receive the mating side 330 (FIG. 8) of the receptacle connector 306 (FIG. 8). The electrical terminals 325 are disposed within the connector-receiving region 422.

As shown in the enlarged portion of FIG. 14, the header connector 316 also includes signal conductors 414 that are held by the connector body 410. The signal conductors 414 extend substantially linearly through the connector body 410 and include signal contacts (or contact tails) 416 that project from the mounting side 412. The signal contacts 416 are configured to mechanically and electrically engage plated thru-holes (not shown) of the circuit board 318 (FIG. 8).

The signal contacts 416 and the grounding matrix 321 may have similar configurations as the configurations of the signal contacts 368 (FIG. 10) and the grounding matrix 310 (FIG. 8). For example, as shown in the enlarged portion of FIG. 14, the signal contacts 416 form signal pairs 424A-424C and each signal pair 424A-424C extends through a corresponding opening 426 of the grounding matrix 321. Adjacent signal pairs are separated and electrically shielded from each other by portions of the grounding matrix 321. More specifically, the adjacent signal pairs 424A and 424B are separated from each other by a linkage 428, and the adjacent signal pairs 424B and 424C are separated from each other by ground contacts 430, 432.

The grounding matrix 321 also includes attachment features 434. Like the attachment features 352 (FIG. 9), the attachment features 434 may be projections or tabs that are configured to directly engage the connector body 410. The attachment features 434 may extend into corresponding feature cavities or openings 436 of the connector body 410 and directly engage the connector body 410. In particular embodiments, the attachment features 434 form an interference fit with surfaces of the connector body 410 that define the feature cavities 436. As such, a frame 438 of the grounding matrix 321 may be held at a designated position that is spaced apart from the mounting side 412 by a separation distance $X_2$. Like the grounding matrix 310, the grounding matrix 321 may be permitted to float with respect to the mounting side 412. For example, the grounding matrix 321 may be permitted to float to and from the mounting side 412 and/or to float laterally such that the frame 438 moves parallel to the mounting side 412.

Although not shown, the header connector 316 may be mounted to the circuit board 318 in a similar manner as described with respect to the receptacle connector 306 (FIG. 8) and the circuit board 308 (FIG. 8). When mounted, the ground contacts (e.g., the ground contacts 430, 432) of the grounding matrix 321 may directly engage the engagement side 322 (FIG. 8) of the circuit board 318 and the mounting side 412 of the header connector 316. As such, multiple contact points between the grounding matrix 321 and the engagement side 322 and multiple contact points between the grounding matrix 321 and the mounting side 412 may be formed and sustained throughout operation of the circuit board assembly 304 (FIG. 8). In addition to the grounding matrix 321, ground pathways may be formed through conductive body material (not shown) of the connector body 410 and ground vias (not shown) of the circuit board 318 in a similar manner as described above with respect to the circuit board assembly 302 (FIG. 8).

Figure 15:
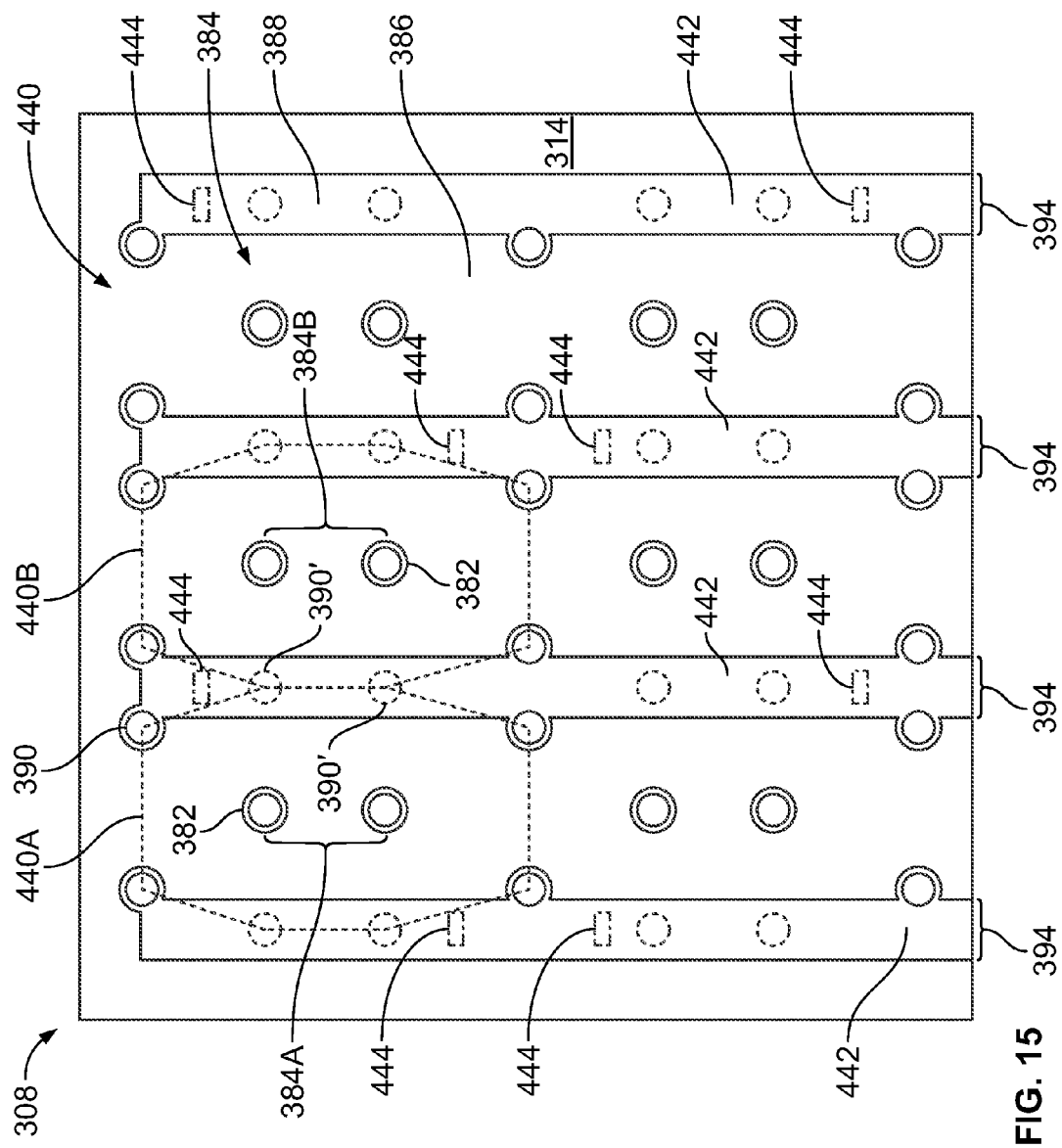
FIG. 15 is a plan view of a circuit board that illustrates an arrangement of signal vias, ground vias, and contact areas in greater detail.

FIG. 15 is a plan view of the circuit board 308 and illustrates one arrangement of the signal vias 382, the ground vias 390, and the contact areas 394 in greater detail. It should be noted that the circuit board 318 (FIG. 8) can be similar or identical to the circuit board 308. The signal vias 382 are arranged to form a plurality of signal pairs 384. In the illustrated embodiment, the signal pairs 384 are arranged in a row and column configuration although other configurations may be used. As shown, the conductive layer 388, which is shaded in FIG. 15, spans across the engagement side 314 under the mask layer 386 and joins the ground vias 390.

The contact areas 394 of the conductive layer 388 are exposed along the engagement side 314. In FIG. 15, the contact areas 394 form elongated strips 442 in which each elongated strip 442 joins a plurality of the ground vias 390. The elongated strips 442 may extend continuously along one dimension of the engagement side 314. In an exemplary embodiment, the conductive layer 388 extends beneath the mask layer 386 such that each elongated strip 442 is part of a single layer. Alternatively, the conductive layer 388 may be, for example, etched such that the elongated strips 442 are part of separate structures along the engagement side 314.

The contact areas 394 are sized and shaped to be directly engaged by the ground contacts 340-343 (FIG. 9) when the receptacle connector 306 (FIG. 8) is mounted onto the circuit board 308 as described herein. For example, contact points 444 are indicated along the contact areas 394 in FIG. 15. The contact points 444 represent areas where the distal ends 355, 357 (FIG. 9) of the ground contacts 340-343 directly engage the contact areas 394. Due to tolerances in manufacturing of the various components of the receptacle connector 306 and the grounding matrix 310 (FIG. 9), the size and shape of the contact areas 394 may permit some misalignment between the distal ends 355, 357 and the conductive layer 388. Furthermore, during a mounting operation, the size and shape of the contact areas 394 may permit the distal ends 355, 357 of the ground contacts 340-343 to slide along the conductive layer 388 (also referred to as "wiping").

In certain embodiments, the ground vias 390 are positioned to form shield arrays 440 that surround corresponding signal pairs 384. Representative perimeters of the shield arrays 440A and 440B are indicated by dashed lines that extend between and connect the corresponding ground vias 390 of the corresponding shield arrays 440A, 440B. The shield arrays 440 may be similar to the shield arrays described in the '632 Application, which is incorporated herein by reference in its entirety.

The shield arrays 440 are configured to reduce crosstalk experienced by the signal pairs 384. By way of example, the signal pairs 384A and 384B are adjacent signal pairs. The shield arrays 440A, 440B surround the signal pairs 384A and 384B, respectively. In the illustrated embodiment, each of the shield arrays 384A and 384B includes eight ground vias 390. However, alternative configurations of the shield arrays may include fewer or more ground vias. In particular embodiments, the shield arrays 440A, 440B may share common ground vias 390'. For example, the shield arrays 440A, 440B share two common ground vias 390'. In other embodiments, the shield arrays 341-343 may not share common ground vias.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A circuit board assembly comprising:
    an electrical connector comprising a connector body having a mounting side and an array of signal contacts disposed along the mounting side, the array of signal contacts having gaps formed between adjacent signal contacts of the array;
    a circuit board having an engagement side, the circuit board including signal vias and ground vias; and
    a grounding matrix positioned between the engagement side and the mounting side, the grounding matrix including a plurality of ground contacts that are interconnected in a web-like manner to define a plurality of openings, wherein the signal contacts of the electrical connector extend through the openings to engage the signal vias, the ground contacts electrically coupling the ground vias of the circuit board to a ground pathway through the electrical connector.

2. The circuit board assembly of claim 1, wherein the grounding matrix includes attachment features that directly engage the connector body to hold the grounding matrix at a designated position along the mounting side.

3. The circuit board assembly of claim 1, wherein the signal vias comprise plated thru-holes, the signal contacts being inserted into the plated thru-holes.

4. The circuit board assembly of claim 1, wherein the signal contacts are arranged in signal pairs, the gaps extending between adjacent signal pairs.

5. The circuit board assembly of claim 1, wherein the ground vias comprise microvias.

6. The circuit board assembly of claim 1, wherein the circuit board includes a conductive layer that is exposed along the engagement side, the conductive layer being coupled to the ground vias, the ground contacts configured to engage at least one of the conductive layer or the ground vias.

7. The circuit board assembly of claim 6, wherein the circuit board includes a mask layer, the mask layer covering portions of the conductive layer such that exposed contact areas of the conductive layer are formed along the engagement side, the ground contacts of the grounding matrix engaging the contact areas of the conductive layer.

8. The circuit board assembly of claim 6, wherein the ground contacts include distal ends permitted to engage and slide along the conductive layer when the electrical connector is mounted to the circuit board.

9. The circuit board assembly of claim 6, wherein the ground contacts include flex portions that move toward the mounting side of the connector body when the flex portions are compressed between the mounting side and the board surface of the circuit board.

10. An electrical connector comprising:
a connector body having a mounting side and an array of signal contacts disposed along the mounting side, the array of signal contacts having gaps formed between adjacent signal contacts of the array; and
a grounding matrix extending along the mounting side, the grounding matrix including a plurality of ground contacts that are interconnected in a web-like manner to define a plurality of openings, wherein the signal contacts of the electrical connector extend through the openings, the ground contacts being electrically coupled to the electrical connector, wherein the grounding matrix includes attachment features that directly engage and couple to the electrical connector to hold the grounding matrix along the mounting side in a designated position.

11. The electrical connector of claim 10, further comprising signal conductors that include the signal contacts, the ground contacts being electrically coupled to one or more ground pathways that extend through the electrical connector when the grounding matrix is compressed between the electrical connector and an electrical component.

12. The electrical connector of claim 10, wherein the ground contacts include inward-extending contacts that extend toward the mounting side.

13. The electrical connector of claim 10, wherein the attachment features comprise projections that extend toward and engage the electrical connector.

14. The electrical connector of claim 10, wherein the ground contacts include outward-extending contacts that extend away from the mounting side.

15. The electrical connector of claim 14, wherein the outward-extending contacts include flex portions that are configured to resiliently flex toward the mounting side when the outward-extending contacts engage an electrical component.

16. A circuit board comprising:
a board substrate having opposite first and second sides, wherein the board substrate includes a conductive layer extending along the first side;
signal vias located along the first side, the signal vias arranged to form multiple signal pairs, the signal vias being electrically isolated from the conductive layer; and
ground vias located along the first side, the ground vias being positioned relative to the signal pairs to electrically shield the signal pairs from one another, wherein the conductive layer extends between and joins the ground vias, the conductive layer being exposed along the first side to engage an electrical component.

17. The circuit board of claim 16, wherein the circuit board includes a mask layer, the mask layer covering portions of the conductive layer.

18. The circuit board of claim 16, wherein exposed portions of the conductive layer constitute contact areas, the contact areas being sized and shaped to permit ground contacts to wipe therealong.

19. The circuit board of claim 16, wherein the ground vias form shield arrays that surround the signal vias.

20. The circuit board of claim 16, wherein the signal vias comprise plated thru-holes and the ground vias comprise microvias.

* * * * *